(12) United States Patent
Lim

(10) Patent No.: US 7,728,408 B2
(45) Date of Patent: Jun. 1, 2010

(54) VERTICLE BJT, MANUFACTURING METHOD THEREOF

(75) Inventor: Su Lim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 119 days.

(21) Appl. No.: 11/841,032

(22) Filed: Aug. 20, 2007

(65) Prior Publication Data

US 2008/0048296 A1    Feb. 28, 2008

(30) Foreign Application Priority Data

Aug. 22, 2006    (KR) .................... 10-2006-0079322

(51) Int. Cl.
*H01L 21/331*    (2006.01)

(52) U.S. Cl. ............... 257/565; 438/342; 257/E27.039

(58) Field of Classification Search .................. 257/565
See application file for complete search history.

(56) References Cited

U.S. PATENT DOCUMENTS

| 5,243,207 A * | 9/1993 | Plumton et al. .............. 257/192 |
| 2005/0167784 A1* | 8/2005 | Losehand .................... 257/552 |
| 2006/0199348 A1 | 9/2006 | Bromberger |

FOREIGN PATENT DOCUMENTS

KR    10-2006-0010665    2/2006

* cited by examiner

*Primary Examiner*—Thao X Le
*Assistant Examiner*—Kimberly Trice
(74) *Attorney, Agent, or Firm*—Sherr & Vaughn, PLLC

(57) ABSTRACT

A vertical BJT which has a maximal current gain for a photodiode area. According to embodiments, since the BJT can be formed together with the photodiode, and collector current flows up and down based on the double base structure, the magnitude of the current may be increased.

12 Claims, 9 Drawing Sheets

VERTICLE BJT, MANUFACTURING METHOD THEREOF

The present application claims priority under 35 U.S.C. 119 to Korean Patent Application No. 10-2006-0079322 (filed on Aug. 22, 2006), which is hereby incorporated by reference in its entirety.

BACKGROUND

In general, an image sensor is a semiconductor device that converts an optical image into electrical signals. The image sensor may be a Charge Coupled Device (CCD) image sensor, in which individual Metal Oxide Silicon (MOS) capacitors are located closely to each other such that charge carriers are stored in or discharged from the capacitors. A Complementary Metal Oxide Silicon (CMOS) image sensor employs a switching mode to sequentially detect output by providing MOS transistors corresponding to the number of pixels. CMOS technology may integrate peripheral devices, such as a control circuit and a signal processing circuit, into the sensor. The CMOS image sensor may include a photodiode and a MOS transistor in each unit pixel to detect signals in a switching mode and form images.

According to the related art, in a process of manufacturing the CMOS image sensor as described above, an NPN device can be manufactured by applying a CMOS process to an epitaxial layer. As shown in FIGS. 1 and 2, in the vertical NPN BJT device, a deep N-well layer 102 is formed over a substrate 100. A P-well 112 and an N-well 110 are formed over the deep N-well layer 102. An N type emitter E and a P type base B are formed in the P-well 112. An N type collector C is formed in the N-well 110. Shallow Trench Isolation (STI) areas 120 are formed among the emitter E, the base B and the collector C in order to isolate them from each other. An emitter contact area 126 and a collector contact area 130, into which high density N type ions are implanted, and a base contact area 128, into which P type ions are implanted, are formed over the upper portions of the emitter area, the collector area and the base area, respectively.

The deep N-well layer 102 allows electrons to flow from the N type emitter E toward the N type collector C. In this way, vertical collector current IC is generated in a normal active mode. In a BJT device, a ratio of collector current IC to base current IB (i.e. IC/IB) is referred to as a common emitter current gain (beta) and is an important factor that determines the DC performance of the device. Since the thickness and width of a single base layer are fixed by the manufacturing process, the optimal current gain of the related vertical BJT device cannot be obtained through a related CMOS process.

SUMMARY

Embodiments relate to a vertical Bipolar Junction Transistor (BJT) which may realize a maximized current gain in combination with a photodiode area.

Embodiments relate to a vertical bipolar junction transistor which may include first and second collector areas in different epitaxial layers. An emitter area may be interposed between the first and second collector areas. A base area may be formed over the first collector area and the emitter area, and the second collector area and the emitter area.

Embodiments relate to a method for manufacturing a vertical bipolar junction transistor. The method includes preparing a substrate. A first collector area may be formed by implanting first impurity type ions into the substrate. A first epitaxial layer may be formed over the substrate. Second impurity type impurities may be implanted into the first epitaxial layer. A first collector connection area, which is connected to the first collector area, may be formed by implanting the first impurity type ions into the first epitaxial layer. An emitter area may be formed by implanting the first impurity type ions into the first epitaxial layer. A second epitaxial layer may be formed over the first epitaxial layer. Shallow trench isolation areas may be formed. A p-well may be formed by implanting the second impurity type impurities into the second epitaxial layer. A second collector connection area, which is connected to the first collector connection area, and an emitter connection area, which is connected to the emitter area, may be formed by implanting first impurity type impurities into the p-well. A second collector area, a collector contact area connected to the second collector area, and an emitter contact area over the emitter area may be formed by implanting the first impurity type ions into the second epitaxial layer. A base contact area may be formed by implanting second impurity type ions into the second epitaxial layer.

DRAWINGS

Figure 1:
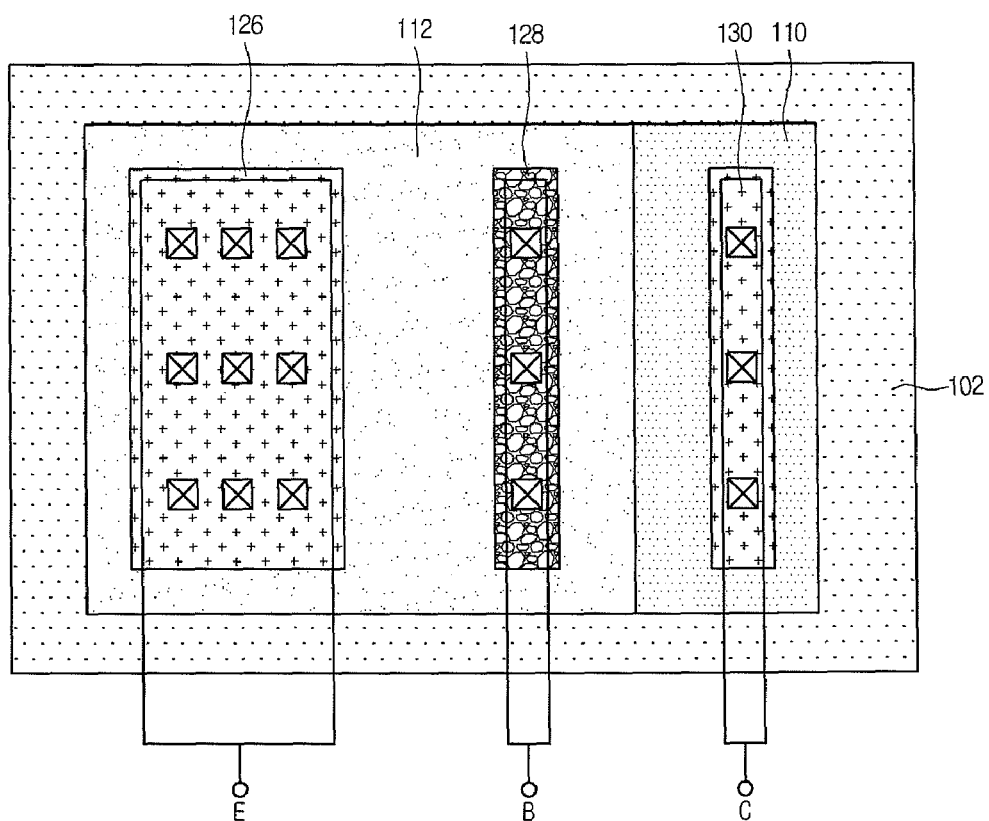
FIG. 1 is a plan view showing a related vertical NPN BJT device.
Figure 2:
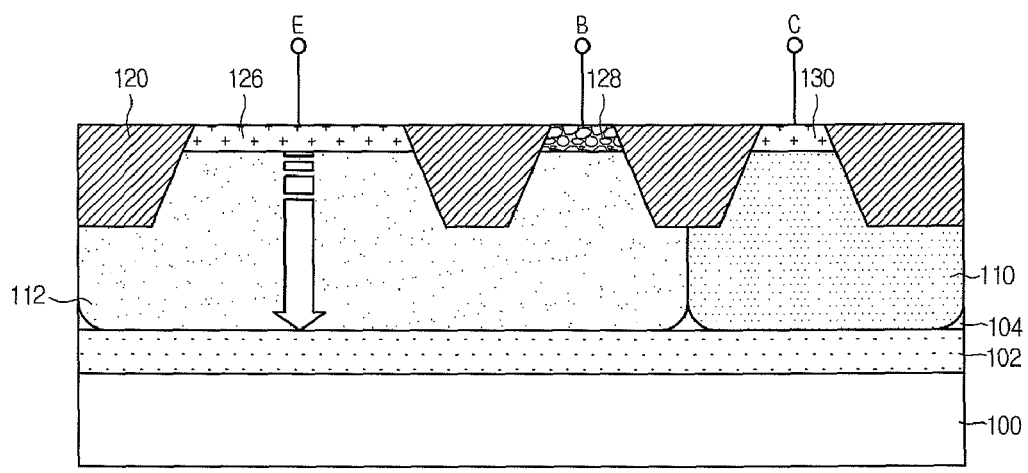
FIG. 2 is a sectional view showing the related vertical NPN BJT device in FIG. 1.
Figure 3:
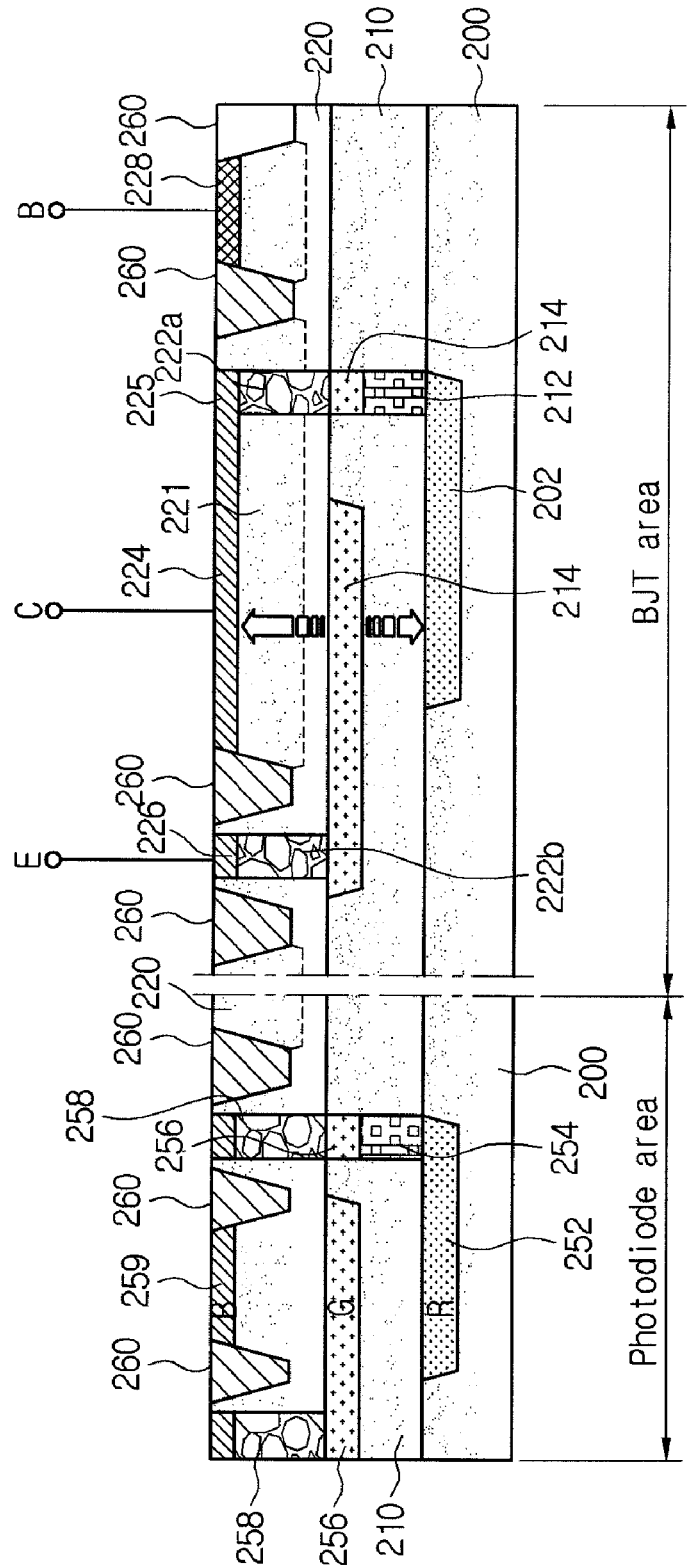

Example FIG. 3 is a sectional view showing a photodiode area and a BJT area according to embodiments.

Figure 4A:
Figure 4B:
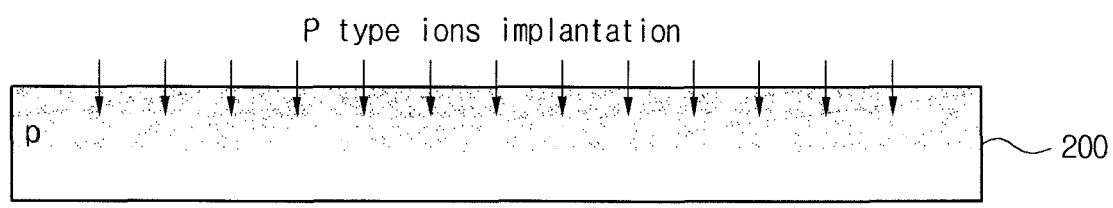
Figure 4C:
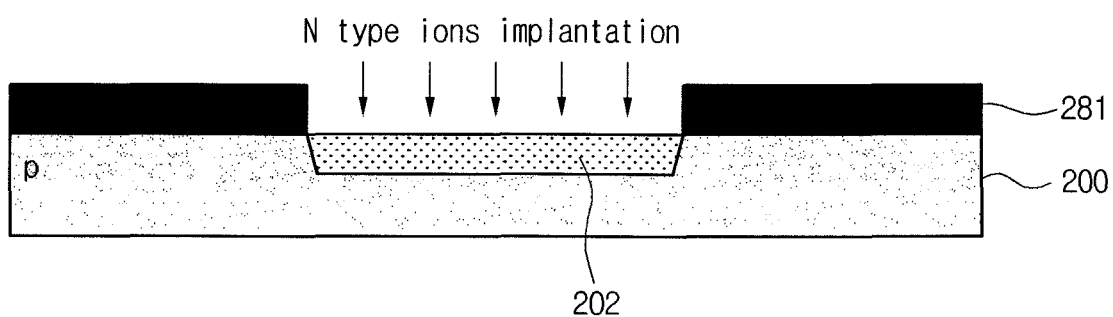
Figure 4D:
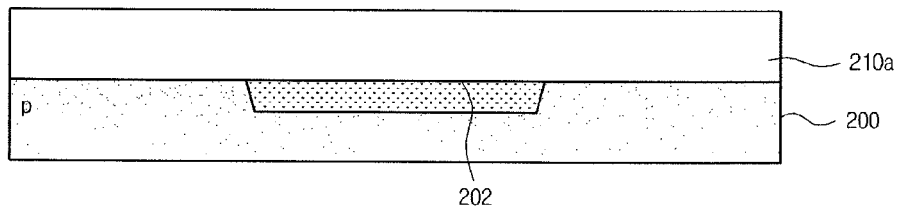
Figure 4E:
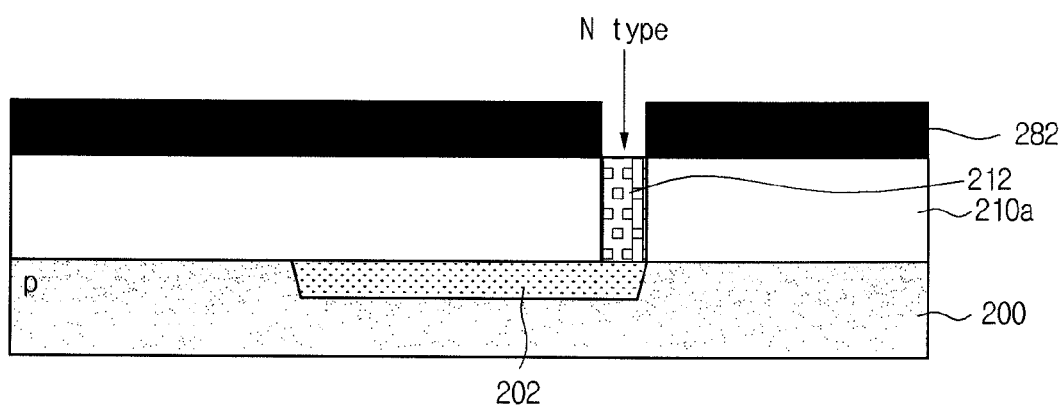
Figure 4F:
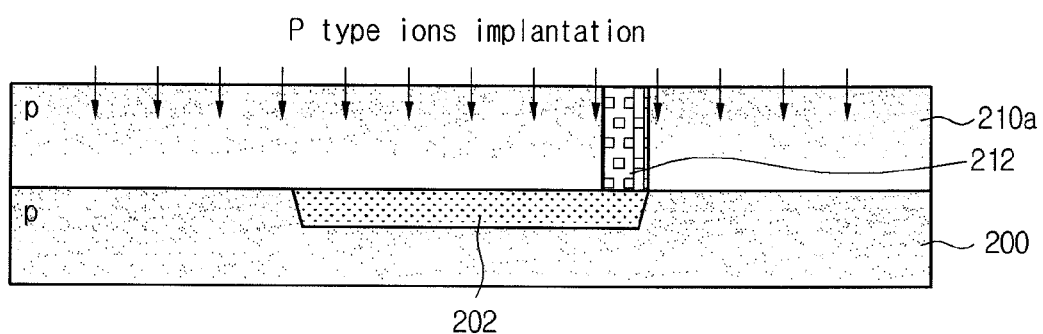
Figure 4G:
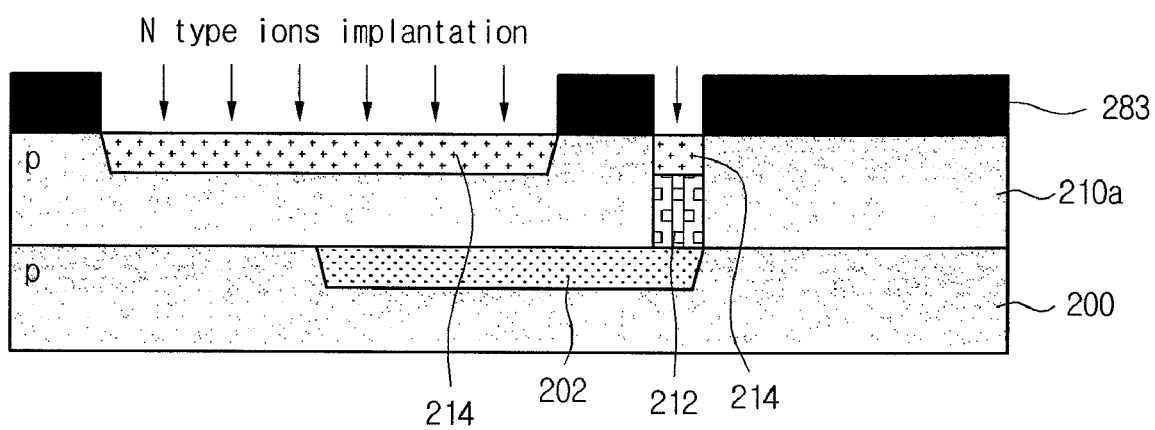
Figure 4H:
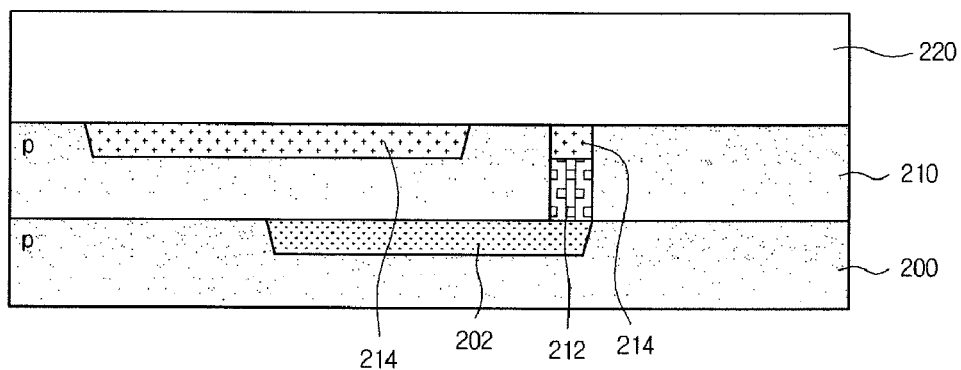
Figure 4I:
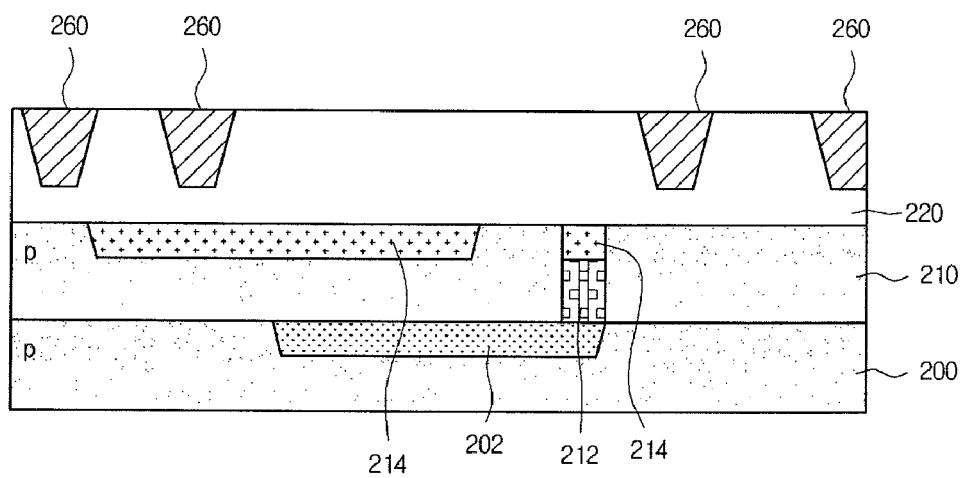
Figure 4J:
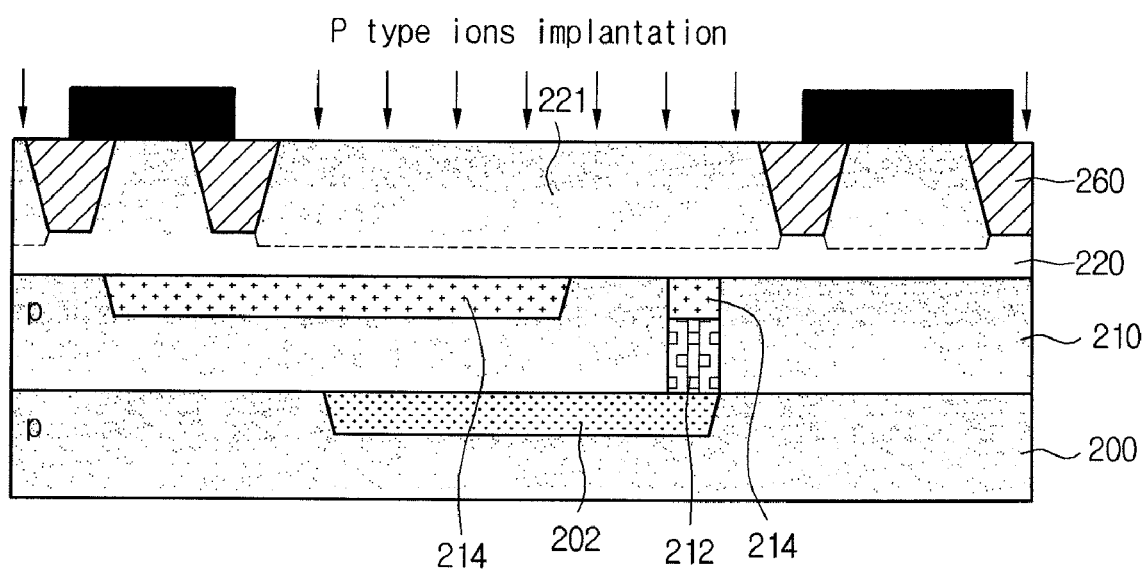
Figure 4K:
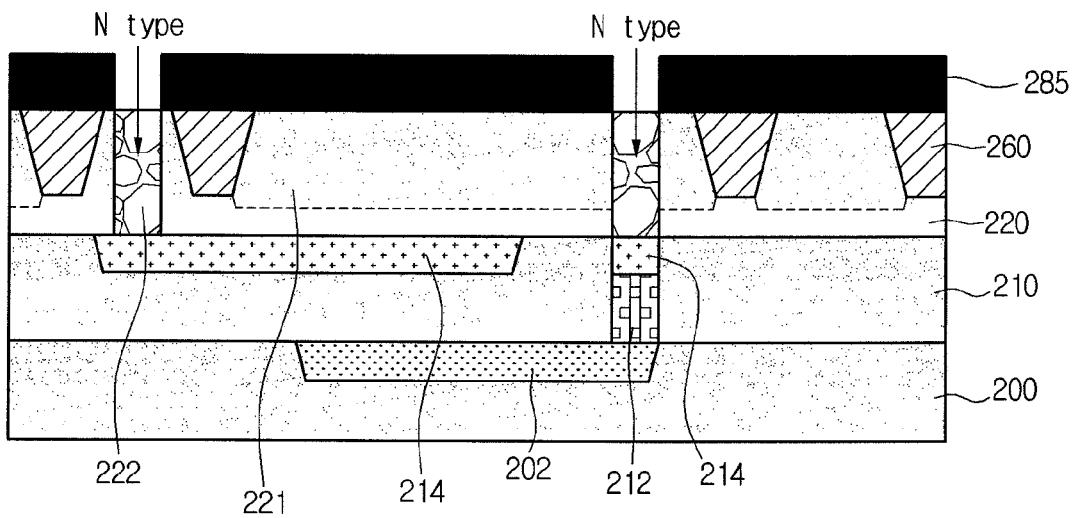
Figure 4L:
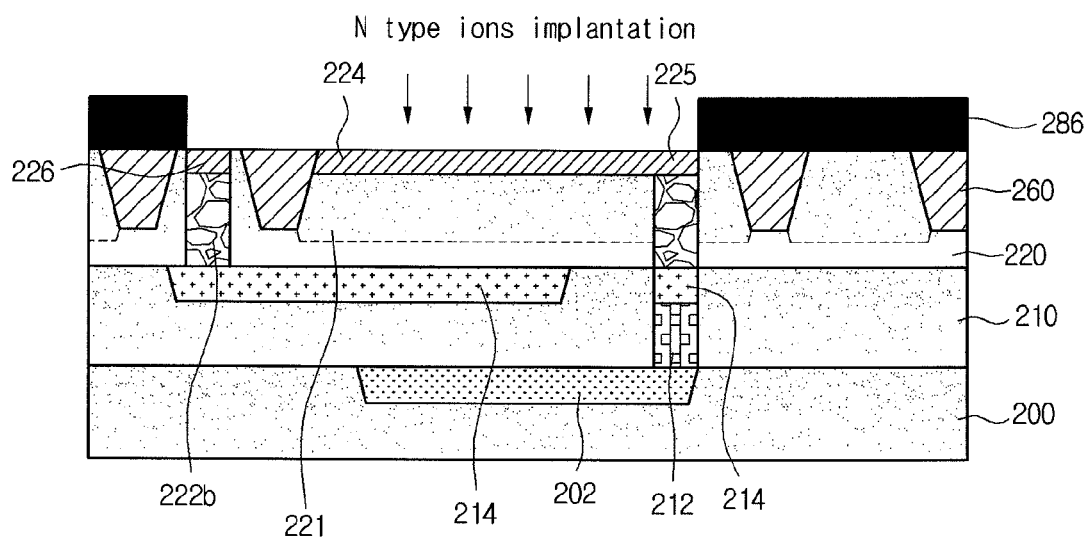
Figure 4M:
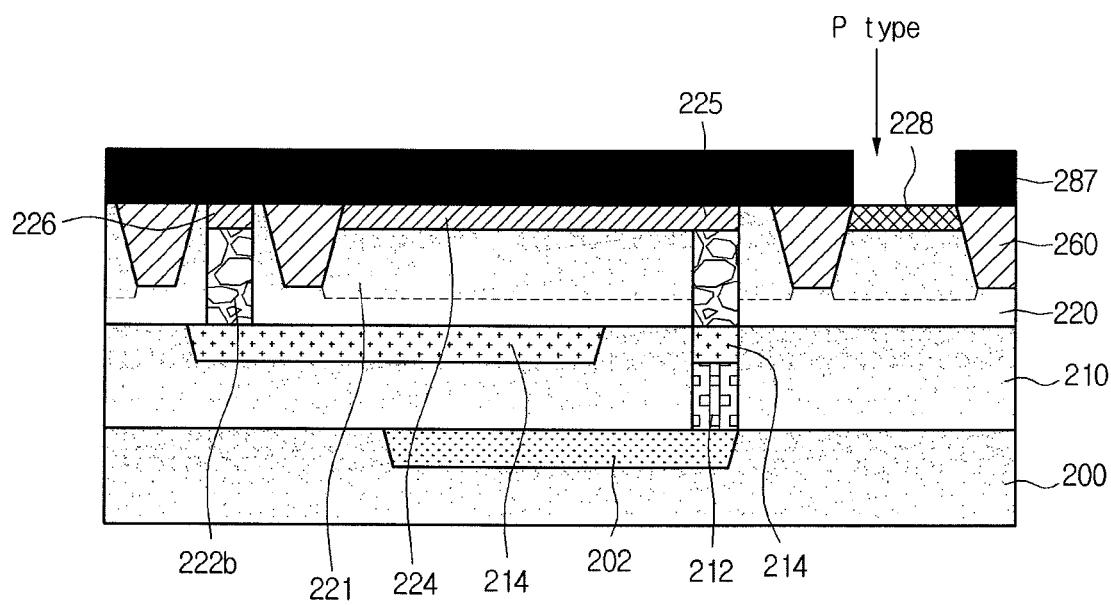
Figure 4N:
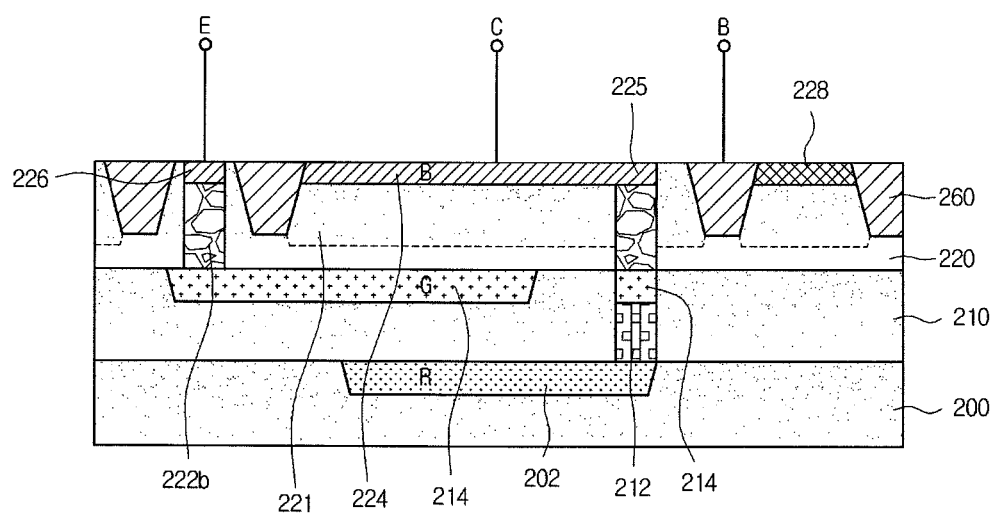

Example FIGS. 4a to 4n are sectional views sequentially showing the procedure for manufacturing a BJT according to embodiments.

DESCRIPTION

As shown in example FIG. 3, in a photodiode area, a red photodiode area 252 may be formed in a first epitaxial layer 200 formed over a semiconductor substrate. A second epitaxial layer 210 may be grown, and a second P type epitaxial layer 210 may be formed by implanting P type ions into the second epitaxial layer 210. A first plug 254 may be formed by implanting high density ions into the second P type epitaxial layer 210 to connect second P type epitaxial layer 210 to red photodiode area 252, to route signals.

After forming a photoresist layer pattern over the second P type epitaxial layer 210, a green photodiode area 256 may be formed in the second P type epitaxial layer 210 by partially implanting ions into the second P type epitaxial layer 210. A third epitaxial layer 220 may be grown over the second P type epitaxial layer 210 including the green photodiode area 256. An STI area 260 may be formed in the third epitaxial layer 220 to define an active area.

After forming a photoresist layer pattern over the third epitaxial layer 220, ions may be implanted into the third epitaxial layer 220, thereby forming a second plug 258 in the third epitaxial layer 220. A well process may form a photoresist layer pattern over the third p type epitaxial layer 220 including the STI 260. Ion implantation may be performed to form the second plug 258 over the first plug 254 connected to the red photodiode area 252. In this way, the second plug 258 may be connected to the green photodiode area 256.

After forming a photoresist layer pattern over the third p type epitaxial layer 220, ions may be implanted into the third p type epitaxial layer 220, thereby forming a blue photodiode area 259. The red, green and blue photodiode areas 252, 256 and 259 are vertically aligned, thereby forming one pixel.

In an NPN BJT manufacturing process, a first N type collector area 202 may be formed in the first p type epitaxial layer 200 in the process of forming the red photodiode area 252. A first N type collector connection area 212 may be formed in the process of forming the first plug 254. An N type emitter area 214 may be formed in the process of forming the green photodiode area 256. The emitter area 214 extends horizontally such that a predetermined portion of the emitter area 214 overlaps with the first collector area 202 in a longitudinal direction.

In the process of forming the second plug 258, a second collector connection area 222a may be formed to connect the first collector connection area 212 to an upper layer. An emitter connection area 222b may simultaneously be formed to connect the emitter area 214 to an upper layer.

In the process of forming the blue photodiode area 259, an N type emitter contact area 226 may be formed over the emitter connection area 222b. An N type collector contact area 225 and a second collector area 224 may be formed to contact second collector connection area 222a. A predetermined portion of the second collector area 224 horizontally overlaps with a first collector area 202 and the emitter area 214 in a longitudinal direction.

After forming an additional photoresist layer pattern over emitter area 214 and second collector area 224, a P type base contact area 228 may be formed. STI areas 260 may be formed among the emitter E, the base B and the collector C to isolate them from each other. The base area may be connected to the second P type epitaxial layer 210, and the third P type epitaxial layer 220, thereby forming a double base structure. Accordingly, electrons may be injected into the second collector area 225 and the first collector area 202, which may be aligned above and below the emitter area 214, respectively.

A ratio (i.e. IC/IB) of collector current IC to base current IB is referred to as a common emitter current gain (beta) in an NPN BJT. Since collector current flows up and down according to the double base structure of embodiments, the magnitude of the current may be increased. A relatively large current gain may be obtained in the BJT of embodiments as compared to related BJTs of similar size.

As shown in example FIG. 4a, a semiconductor substrate may be prepared or the first epitaxial layer 200a may be grown over the semiconductor substrate. As shown in example FIG. 4b, P type ions, for example boron ions, may be implanted into the first epitaxial layer 200a, forming the first P type epitaxial layer 200.

As shown in example FIG. 4c, a first photoresist layer pattern 281 may be formed with an opening exposing a portion of first P type epitaxial layer 200. N type ions, for example arsenic ions, may be implanted with an energy of several tens of KeV into the first P type epitaxial layer 200, thereby forming first collector area 202 and red photodiode 252 (see example FIG. 3). Then, first photoresist layer pattern 281 may be removed.

As shown in example FIG. 4d, the second epitaxial layer 210a may be formed over the first P type epitaxial layer 200 and first collector area 202. As shown in example FIG. 4e, a second photoresist layer pattern 282 may be formed with an opening exposing a portion of second epitaxial layer 210a. N type ions, for example arsenic ions, may be implanted with an energy of several hundreds to thousands of KeV into second epitaxial layer 210a, thereby forming first collector connection area 212 and first plug 254 (see example FIG. 3). Then, the second photoresist layer pattern 282 may be removed.

As shown in example FIG. 4f, P type ions, for example boron ions, may be implanted into the surface of second epitaxial layer 210a, forming second P type epitaxial layer 210. As shown in example FIG. 4g, a third photoresist layer pattern 283 may be formed with an opening exposing a portion of second P type epitaxial layer 210. N type ions, for example arsenic ions, may be implanted with an energy of several tens of KeV into the second epitaxial layer 210, thereby forming the emitter area 214 and green photodiode 256 (see example FIG. 3). Then, the third photoresist layer pattern 283 may be removed.

As shown in example FIG. 4h, third epitaxial layer 220 may be formed over second P type epitaxial layer 210 in which emitter area 214 is formed. As shown in example FIG. 4i, STIs 260, which are isolation areas, may be formed in the third epitaxial layer 220.

As shown in example FIG. 4j, a fourth photoresist layer pattern 284 may be formed with an opening exposing a portion of third epitaxial layer 220. P type ions may be implanted into the third epitaxial layer 220, thereby forming the P-well 221. Then, the fourth photoresist layer pattern 284 may be removed.

As shown in example FIG. 4k, a fifth photoresist layer pattern 285 may be formed with an opening exposing a portion of third epitaxial layer 220. N type ions, for example arsenic ions, may be implanted with an energy of several hundreds to thousands of KeV into the third epitaxial layer 220, thereby forming second collector connection area 222a, and emitter connection area 222b and the second plug (see example FIG. 3). Then, the fifth photoresist layer pattern 285 may be removed.

As shown in example FIG. 4l, a sixth photoresist layer pattern 286 may be formed with an opening exposing a portion of third epitaxial layer 220. N type ions may be implanted into the third epitaxial layer 220, forming emitter contact area 226 over the emitter connection area 222b, also forming the second collector area 225 and the collector contact area 224 over the P-well 221, and the blue photodiode 259 (see example FIG. 3). Then, the sixth photoresist layer pattern 286 may be removed.

As shown in example FIG. 4m, a seventh photoresist layer pattern 287 may be formed with an opening exposing a portion of third epitaxial layer 220. P type ions may be partially implanted into third epitaxial layer 220, thereby forming the base contact area 228. As a result, as shown in example FIG. 4n, the NPN BJT with the double base structure can be formed using the photodiode process. Then, the seventh photoresist layer pattern 287 may be removed.

In the NPN BJT of embodiments, since collector current flows up and down according to the double base structure, the magnitude of the current may be increased. A relatively large current gain may be obtained in the BJT of embodiments as compared to related BJTs of similar size.

According to the vertical BJT of embodiments, since the BJT may be formed together with the photodiode and collector current flows up and down based on the double base structure, the magnitude of the current may be increased. A relatively large current gain may be obtained in the BJT of embodiments as compared to related BJTs of similar size.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   first and second collector areas in distinct epitaxial layers;
   an emitter area between the first and second collector areas; and
   a base area over the first collector area, the second collector area and the emitter area, wherein the first collector area, the emitter area and the second collector area horizontally extend such that predetermined portions of the first collector area, the emitter area and the second collector area overlap with each other over a substrate in a longitudinal direction.

2. The apparatus of claim 1, wherein the first collector area, the emitter area and the second collector area are formed in first, second, and third epitaxial layers, respectively.

3. The apparatus of claim 2, wherein a emitter contact area connected to the emitter area, a collector contact area connected to the first and second collector areas, and a base contact area connected to the base area are formed in the third epitaxial layer.

4. The apparatus of claim 1, wherein the first collector area, the emitter area and the second collector area are a first impurity type, and the base area is a second impurity type.

5. The apparatus of claim 4, wherein the first impurity type is obtained by implanting N type ions, and the second impurity type is obtained by implanting P type ions.

6. The apparatus of claim 1, wherein the first and second collector areas are interconnected through a first impurity collector area.

7. An apparatus comprising:
a first collector area formed in a first epitaxial layer;
a second collector area formed in a second epitaxial layer;
an emitter area formed in a third epitaxial layer between the first collector area and the second collector area;
a base area formed over the first collector area, the second collector area and the emitter area;
an emitter contact area formed in the third epitaxial layer and connected to the emitter area;
a first conductive collector contact area formed in the third epitaxial layer and connected to the first collector area and the second collector area; and
a second conductive base contact area formed in the third epitaxial layer and connected to the base area.

8. The apparatus of claim 7, wherein the first collector area, the emitter area and the second collector area are a first conductive type, and the base area is a second conductive type.

9. The apparatus of claim 8, wherein the first conductive type is obtained by implanting N type ions.

10. The apparatus of claim 8, wherein the second conductive type is obtained by implanting P type ions.

11. The apparatus of claim 7, wherein the emitter area horizontally extends such that a predetermined portion thereof overlaps with the first collector area in a longitudinal direction.

12. The apparatus of claim 7, wherein a predetermined portion of the second collector area horizontally overlaps with the first collector area and the emitter area in a longitudinal direction.

* * * * *